(12) United States Patent
Lei et al.

(10) Patent No.: US 9,836,556 B2
(45) Date of Patent: *Dec. 5, 2017

(54) OPTICAL PROXIMITY CORRECTION FOR DIRECTED-SELF-ASSEMBLY GUIDING PATTERNS

(71) Applicant: Mentor Graphics Corporation, Wilsonville, OR (US)

(72) Inventors: Junjiang Lei, Fremont, CA (US); Le Hong, Vacaville, CA (US); Yuansheng Ma, Fremont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/085,096

(22) Filed: Mar. 30, 2016

(65) Prior Publication Data

US 2016/0292348 A1     Oct. 6, 2016

Related U.S. Application Data

(60) Provisional application No. 62/140,363, filed on Mar. 30, 2015.

(51) Int. Cl.
*G06F 17/50* (2006.01)
*G03F 1/36* (2012.01)
(Continued)

(52) U.S. Cl.
CPC ............ *G06F 17/50* (2013.01); *G03F 1/00* (2013.01); *G03F 1/36* (2013.01); *G03F 1/70* (2013.01); *G03F 1/72* (2013.01); *G03F 7/0002* (2013.01)

(58) Field of Classification Search
CPC ... G06F 17/50; G03F 1/00; G03F 1/36; G03F 1/70; G03F 1/72; G03F 7/0002
See application file for complete search history.

(56) References Cited

U.S. PATENT DOCUMENTS 8,336,003 B2 * 12/2012 Cheng .................. G03F 1/38
716/50
8,667,428 B1 * 3/2014 Latypov .............. G06F 17/5081
378/35

(Continued)

OTHER PUBLICATIONS

T. R. Younkin, R. Gronheid, P. Rincon Delgadillo, B. T. Chan, N. Vandenbroeck, S. Demuynck, et al., "Progress in directed self-assembly hole shrink applications," SPIE 2013, pp. 86820L-86820L-11.

(Continued)

*Primary Examiner* — Naum B Levin

(57) ABSTRACT

Aspects of the disclosed technology relate to techniques of optical proximity correction for directed self-assembly guiding patterns. An initial mask pattern for photomask fabrication is first generated by performing a plurality of conventional optical proximity correction iterations. Predicted print errors for two or more via-type features are then determined based on a predicted guiding pattern for the two or more via-type features, a target guiding pattern for the two or more via-type features, and correlation information between a plurality of guiding pattern parameters and location and size parameters for the two or more via-type features. Here the predicted guiding pattern is derived based on the initial mask pattern. Based on the predicted print errors and the correlation information, the initial mask pattern is adjusted to generate a new mask pattern.

16 Claims, 11 Drawing Sheets

Flow chart
600

(51) Int. Cl.
*G03F 1/70* (2012.01)
*G03F 1/72* (2012.01)
*G03F 7/00* (2006.01)
*G03F 1/00* (2012.01)

(56) References Cited

U.S. PATENT DOCUMENTS

| | | | |
|---|---|---|---|
| 9,032,357 B1 | 5/2015 | Robles et al. | |
| 9,111,067 B2* | 8/2015 | Robles | G06F 17/5081 |
| 9,208,275 B2* | 12/2015 | Wang | G06F 17/5068 |
| 9,330,228 B2* | 5/2016 | Robles | G06F 17/5081 |
| 2012/0331428 A1* | 12/2012 | Cheng | G03F 1/38 716/52 |
| 2016/0178999 A1* | 6/2016 | Wuister | G03F 1/70 716/51 |
| 2016/0210397 A1* | 7/2016 | Laenens | G03F 1/36 |
| 2016/0266486 A1* | 9/2016 | Wuister | G03F 7/0002 |
| 2016/0292309 A1* | 10/2016 | Lei | G03F 1/36 |

OTHER PUBLICATIONS

A. Latypov, T. H. Coskun, G. Garner, M. Preil, G. Schmid, J. Xu, Y. Zou, "Simulation of spatial DSA morphology, DSA-aware assist features and block copolymer-homopolymer blend", SPIE 2014, pp. 904908-1-904908-10.

S. Wuister, T. Druzhinina, D. Ambesi, B. Laenens, L. H. Yi, J. Finders, "Influence of Litho Patterning on DSA placement errors", SPIE 2104, pp. 904910-1 904910-13.

S. Wuister, D. Ambesi, T. Druzhinina, E. Peeters, J. Finders, J. K. Wolterink, J. G. E. M. Fraaije, "Fundamental study of placement errors in directed self-assembly", Journal of Micro/Nanolithography, MEMS, and MOEMS, v0l. 13, Jul.-Sep. 2014.

Y. Ma, J. A. Torres, G. Fenger, Y Granik, J. Ryckaert, G. Vanderberghe, J. Bekaert, James Word, "Challenges and opportunities in applying grapho-epitaxy DSA lithography to metal cut and contact/via applications", EMLC 2014.

Azat Latypov, "Computational solution of inverse directed self-assembly problem Alternative Lithographic Technologies V", edited by William M. Tong, Douglas J. Resnick, Proc. of SPIE vol. 8680, 86800Z—© 2013 SPIE—CCC code: 0277-786X/13/$18 - doi: 10.1117/12.2011575 10 pages.

Azat Latypov*a, Moshe Preilb, Gerard Schmidc, Ji Xuc, He Yia , Kenji Yoshimotoc,d, Yi Zoua "Exploration of the directed self-assembly based nano-fabrication design space using computational simulations Alternative Lithographic Technologies V", edited by William M. Tong, Douglas J. Resnick, Proc. of SPIE vol. 8680, 868013—© 2013 SPIE—CCC code: 0277-786X/13/$18—doi: 10.1117/12.2011238.

William Hinsberg*, Joy Cheng, Ho-Cheol Kim and Daniel P. Sanders, "Self-Assembling Materials for Lithographic patterning: Overview, Status and Moving Forward Alternative Lithographic Technologies II", edited by Daniel J. C. Herr, Proc. of SPIE vol. 7637,76370G—© 2010 SPIE—CCC code: 0277-786X110/$18—doi: 10.1117/12.852230 11 pages.

Chi-Chun Liu*a, Jed Piteraa, Neal Laffertyb, Kafai Laib, Charles Rettnera, Melia Tjioa, Noel Arellanoa, Joy Chenga Progress towards the integration of optical proximity correction and directed self-assembly of block copolymers with graphoepitaxy Alternative Lithographic Technologies IV, edited by William M. Tong, Douglas J. Resnick, Proc. of SPIE.

Kafai Lai1, Chi-chun Liu2, Jed Pitera3, Dan J. Dechene1, Anthony Schepis2, Jassem Abdallah2, Hsinyu Tsai4, Mike Guillorn4, Joy Cheng3, Gregory Doerk3, Melia Tjio3, Charles Rettner3, Olalekan, Odesanya1, Melih Ozlem, Neal Lafferty, "Computational Aspects of Optical Lithography Extension by Directed Self-Assembly Optical Microlithography XXVI", edited by Will Conley, Proc. of SPIE vol. 8683, 868304.

\* cited by examiner

OPTICAL PROXIMITY CORRECTION FOR DIRECTED-SELF-ASSEMBLY GUIDING PATTERNS

RELATED APPLICATIONS

This application claims the benefit of U.S. Provisional Patent Application No. 62/140,363, filed on Mar. 30, 2015, entitled "Directed-Self-Assembly Guiding Pattern Optimization" and naming Junjiang Lei et al. as inventors, which application is incorporated entirely herein by reference.

FIELD OF THE DISCLOSED TECHNOLOGY

The present disclosed technology relates to directed self-assembly lithographic patterning technologies. Various implementations of the disclosed technology may be particularly useful for performing optical proximity correction on guiding patterns.

BACKGROUND OF THE DISCLOSED TECHNOLOGY

Conventional lithographic imaging processes employ liquid immersion to increase the effective numerical aperture (NA) and make use of extensive resolution enhancement techniques (RET). This appears adequate to meet the lithographic needs of integrated circuits through the 32 nm generation. Starting from the 22 nm node, the numerical aperture NA has only marginally increased and the $k_1$ value is approaching the theoretical limit of 0.25. Further lithography scaling has relied mainly on double or even multiple patterning techniques. While multiple patterning techniques provide the resolution required for further scaling, the overall cost to implement multiple patterning techniques has reached a level that other techniques may need to be explored.

Directed self-assembly (DSA) has recently emerged as such a technique for lithographic patterning to reach 22 nm and below. In self-assembly, the formation of features of fine geometric dimensions occurs not through external patterning, but through the spontaneous phase behavior found among polymers on the molecular level. Of particular interest are diblock copolymers formed by chemically connecting normally incompatible species, such as poly(styrene) (PS) and poly(methyl-methacrylate) (PMMA). By creating linked chains of these materials and controlling the relative molecular weight, various structures can spontaneously form. The appeal of these structures, easily formed around 20 nm in size, is that the boundaries between the two disparate polymers can be quite uniform, with the uniformity dictated not by the noise properties of a patterning process, but by the relative molecular weight of the polymers. This is a quantity that can be precisely controlled.

One problem with these polymers is that, although local order and roughness can be quite good, small variations in the polymer chain can lead to kinks that reset the self-assembly process. Long range patterns therefore appear somewhat chaotic. The problem of long range order can be addressed by using a conventional patterning process to guide and direct the spontaneous formation of the block co-polymer structures. This "directed self-assembly" can take the form of having the self-assembly occur in grooves (grapho-epitaxy) or other geometrically confined regions or by chemically patterning a surface to create local affinities to the various portions of the block co-polymers (chemo-epitaxy).

In a grapho-epitaxy process, the main mechanism by which the block-copolymer self organizes in useful domains, is dominated by the concept of confinement. Neutral walls or pillars prevent certain chain configurations which then lead to the polymer to adjust its periodic structures along a pre-determined axis. The benefit of this technique is that the guiding pattern can be very local and there is limited interdependency between different organization domains.

A chemo-epitaxy process defines the preferred direction by a chemical brush which changes the surface energy of the substrate, by doing so and due to the different chemical affinity of the different diblock species to the substrate, the material organizes in a preferential direction minimizing the energy required to achieve a specific configuration. The benefit of this technique is the ability to pattern dense gratings or arrays as the guiding patterns are underneath the block-copolymer.

A lot of progress of DSA in getting impressive resolution has been repeatedly demonstrated using the PS-PMMA system. Some record low pitches of sub-15 nm have been observed in laboratory recently. DSA also has an advantage of not requiring new capital equipment investment and can be used complimentary with other lithographic techniques, including EUV and Direct Write Electron Beam (Ebeam). Using a grapho-epitaxy process for contact and via layers seems like a promising technique as it has the potential to reduce total mask count and remove one patterning step from the process of record while maintaining the yield. However, DSA has its own set of challenges that need to be addressed before becoming a viable alternative to current lithographic techniques.

BRIEF SUMMARY OF THE DISCLOSED TECHNOLOGY

Aspects of the disclosed technology relate to techniques of optical proximity correction for directed self-assembly guiding patterns. In one aspect, there is a method comprising: determining predicted print errors for two or more via-type features based on a predicted guiding pattern for the two or more via-type features, a target guiding pattern for the two or more via-type features, and correlation information between a plurality of guiding pattern parameters and location and size parameters for the two or more via-type features, wherein the predicted guiding pattern is derived based on an initial mask pattern for photomask fabrication; and adjusting the initial mask pattern to generate a new mask pattern based on the predicted print errors for the two or more via-type features and the correlation information. The initial mask pattern may be generated by performing a plurality of conventional optical proximity correction iterations.

The method may further comprise: repeating the determining and the adjusting by replacing the initial mask pattern with the new mask pattern until one of one or more termination conditions is met.

The guiding pattern parameters may comprise longest length along line connecting the two via-type features, widest width, distance between two inflection points on two inner edges of a neck region and neck width in the middle of the initial guiding pattern or their linear combinations. The guiding pattern parameters may further comprise curvatures around corners (as indicated by circles 320 and 330 in FIG. 3) and slopes at inflection points (as indicated by line segment 340 in FIG. 3). Alternatively, the guiding pattern parameters may comprise relative coordinates at four points as shown in FIG. 4.

The correlation information may comprise a template error enhancement factor (TEEF). The correlation information may be derived based on simulation or empirical data. The simulations may be Monte-Carlo simulations.

In another aspect, there are one or more non-transitory computer-readable media storing computer-executable instructions for causing one or more processors to perform the above method.

In still another method, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 8 illustrates an example of the template error enhancement factor (TEEF).

Figure 10:
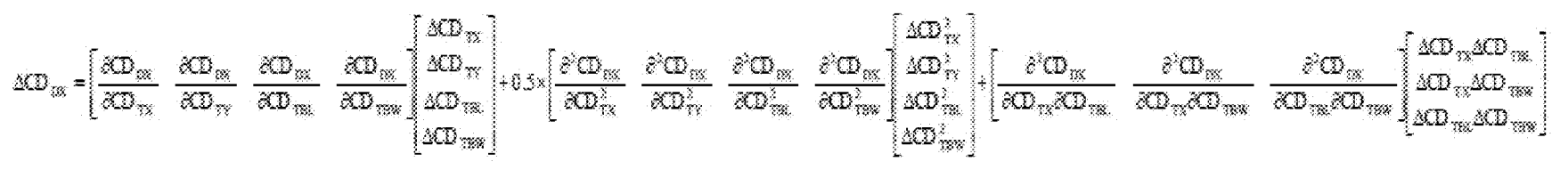

FIG. 10 illustrates an equation for calculating a critical dimension error based on changes on the guiding pattern parameters that may be implemented according to various embodiments of the disclosed technology.

DETAILED DESCRIPTION OF THE DISCLOSED TECHNOLOGY

Figure 1:
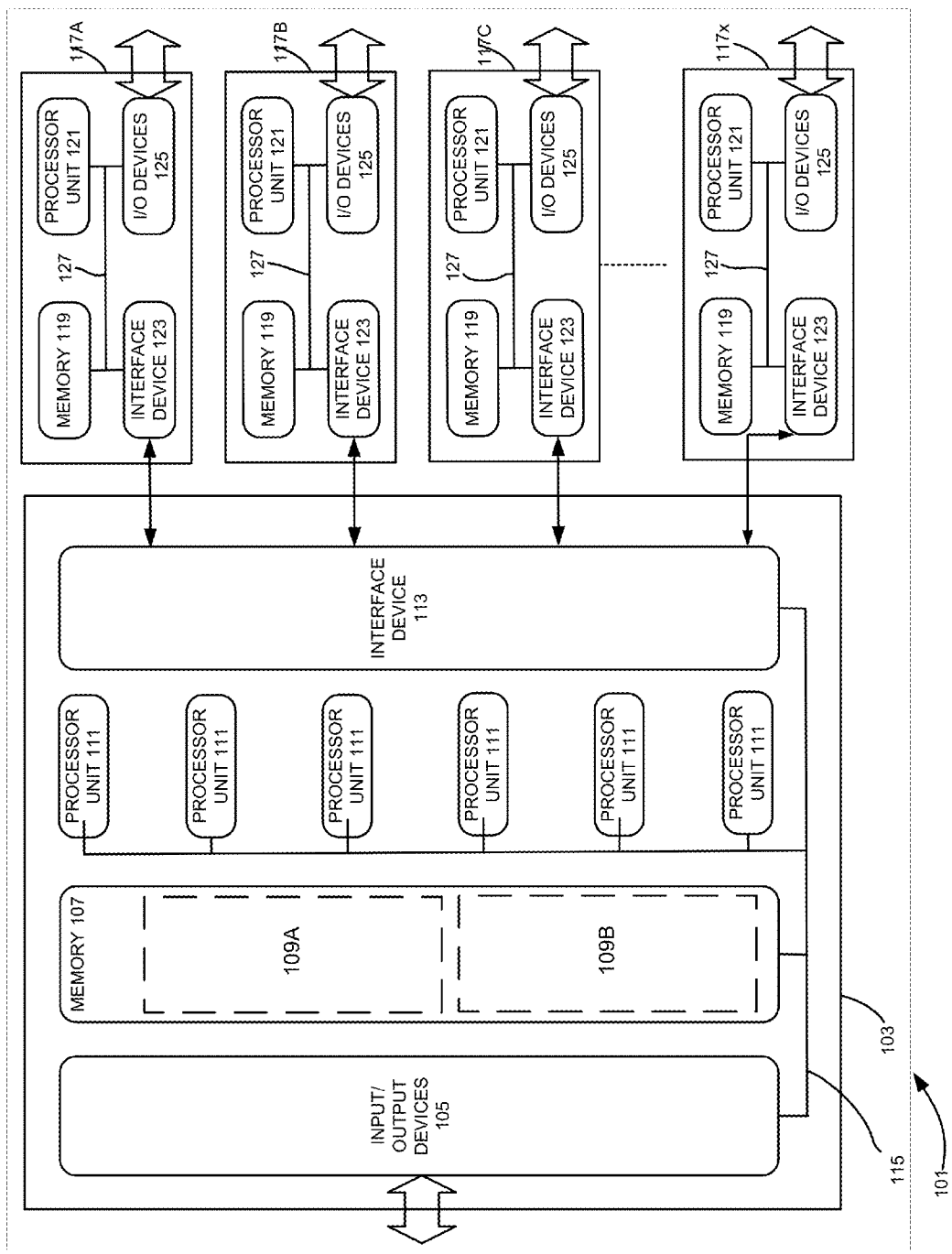
FIG. 1 illustrates an example of a computing system that may be used to implement various embodiments of the disclosed technology.

Various aspects of the present disclosed technology relate to techniques of performing optical proximity correction on guiding patterns for via-type features in a layout design. In the following description, numerous details are set forth for purpose of explanation. However, one of ordinary skill in the art will realize that the disclosed technology may be practiced without the use of these specific details. In other instances, well-known features have not been described in detail to avoid obscuring the present disclosed technology.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "adjust" and "determine" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device.

Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/ Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
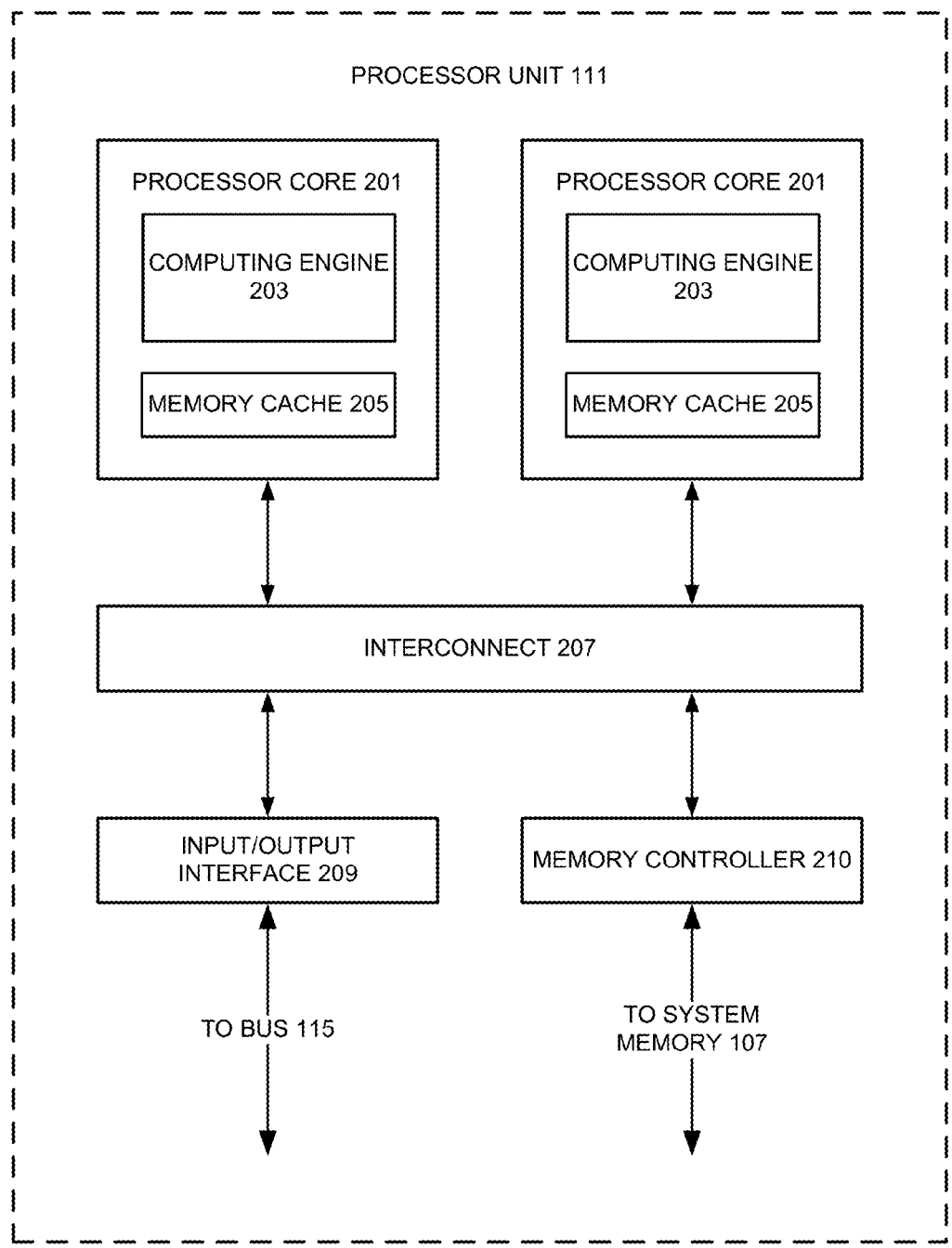
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Guiding Patterns For Directed Self-Assembly

As noted briefly in the section of Background of Disclosed Technology, self-assembly may be directed or guided in two ways: grapho-epitaxy and chemo-epitaxy. In a grapho-epitaxy process, topographical features such as photoresist or hard mask are used to guide the phase segregation. In a chemo-epitaxy process, a thin underlying pining layer is used to pin the phase segregation process. All process steps can be run inside a standard lithography track and etch tool. Directed self-assembly patterning processes may also be divided into two categories according to targeted lithographic patterns: one for line-type features and the other for via-type features. The line-type features may be patterned with chemo-epitaxy or grapho-epitaxy while the vis-type features are usually patterned with grapho-epitaxy.

Patterns for directing or guiding self-assembly of certain materials e.g., block copolymers are called guiding patterns. Patterns formed on a chip after a directed self-assembly process based on guiding patterns should resemble patterns (features) desired to be "printed" (i.e., target patterns/features). In a grapho-epitaxy process employing the PS-PMMA system, for example, self-assembled PMMA patterns correspond to target patterns (target features).

A directed self-assembly process is mainly about free energy minimization and is governed by thermodynamic principles. Generating appropriate guiding patterns is important for producing features close to or matching target features. Three parameters are often used to measure how good a feature matches the target: critical dimensions along X (parallel to the interconnection line between the two features) and Y (perpendicular to the interconnection line between the two features) axes, and placement error. Sometimes, the two critical dimensions may be replaced by critical dimension along Y and hole symmetry (a function of critical dimensions along X and Y).

Given a target feature or feature constraints measured by parameters such as the above mentioned critical dimensions along X and Y and placement error parameters, a guiding pattern may be synthesized using various methods. One such method is described in a U.S. Pat. No. 9,032,357 filed by the Applicant. Another method is described in a U.S. patent application Ser. No. 14/693,304 (U.S. Publication No. 2015/0227676), also filed by the Applicant. From the synthesized guiding pattern, features produced through directed self-assembly may be predicted based on simulations, empirical data or some other methods. The predicted features may be compared with the target one to determine whether the guiding pattern is synthesized properly or not and how the guiding pattern should be adjusted.

In practice, only a few guiding pattern parameters are usually used to describe a guiding pattern. The choice of guiding pattern parameters may affect whether and how fast a good guiding pattern can be found. For example, if a guiding pattern is limited to a certain shape with a limited number of the guiding pattern parameters to be adjustable, an optimized guiding pattern may not be derived. On the other hand, if there are too many guiding pattern parameters to be adjustable, the process of searching for an optimized guiding pattern may become too long to be useful in practice.

Figure 3:
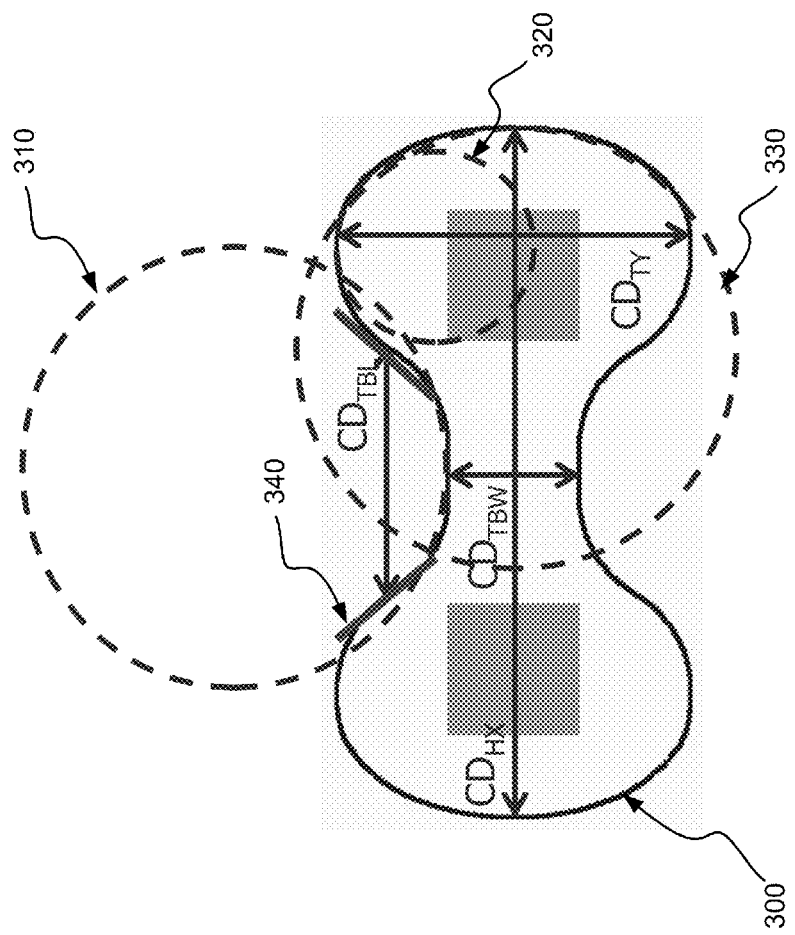
FIG. 3 illustrates an example of a set of guiding pattern parameters that may be employed according to various embodiments of the disclosed technology.

FIG. 3 illustrates an example of a set of guiding pattern parameters that may be employed according to various embodiments of the disclosed technology. A guiding pattern 300 for a pair of via-type features shown in the figure has a dumbbell shape. The set of guiding pattern parameters for this guiding pattern comprises longest length $CD_{HX}$ along a line connecting the two via-type features, widest width $CD_{TY}$, distance $CD_{TBL}$ between two inflection points on two inner edges of a neck region and neck width $CD_{TBW}$ in the middle of the guiding pattern.

The set of guiding pattern parameters may further comprise curvature parameters. Three curvature parameters that may be employed according to various embodiments of the disclosed technology are represented by circles 310, 320 and 330. The circle 310 defines the curvature around the neck area and the circles 320 and 330 define the curvatures at two locations of each of the loops. Additionally or alternatively, the set of guiding pattern parameters may further comprise slope parameters. One such slope parameter may be the slope of a line segment 340 around an inflection point. The use of curvature/slope parameters allows more variations of dumbbell shapes to be produced.

Figure 4:
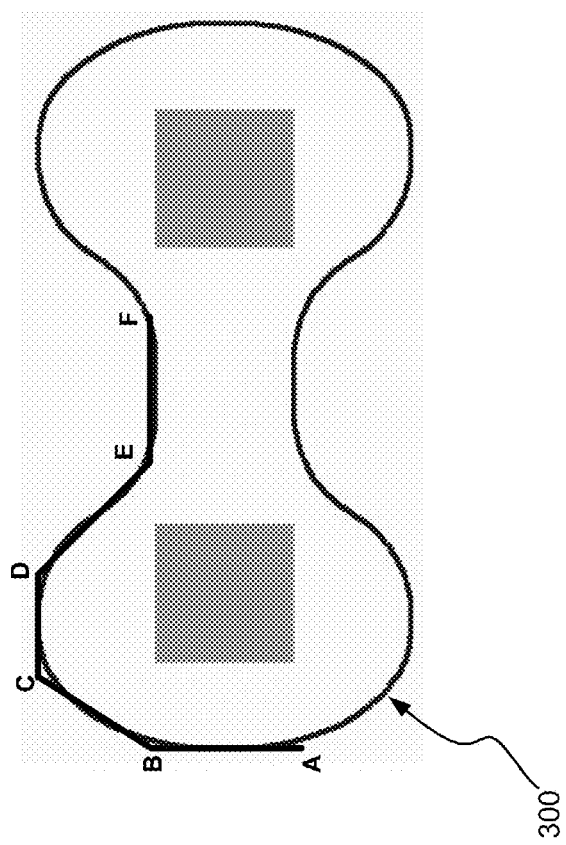
FIG. 4 illustrates another example of a set of guiding pattern parameters that may be employed according to various embodiments of the disclosed technology.

FIG. 4 illustrates another example of a set of guiding pattern parameters that may be employed according to various embodiments of the disclosed technology. In the figure, the guiding pattern 400 is approximated by a polygon. Due to symmetry of the polygon, only five edges of the polygon are shown: AB, BC, CD, DE and EF. The coordinates of vertices B, C, D, and E may serve as a set of guiding pattern parameters. Here, the vertical coordinates for C and D share the same value. The number of independent guiding pattern parameters is thus seven.

Using guiding pattern parameters based on polygon vertices may benefit lithographic operations. Fabrication processes for manufacturing a circuit typically include a series of steps that deposit layers of different materials on a substrate, expose specific portions of each layer to radiation, and then etch the exposed (or non-exposed) portions of the layer away. Each time that a layer of material is exposed to radiation, a mask must be created to expose only the desired areas to the radiation, and to protect the other areas from exposure. The mask is created from circuit design layout data. That is, the geometric elements described in a design layout define the relative locations or areas of the circuit that will be exposed to radiation through the mask. In the case of directed self-assembly, the geometric elements include guiding patterns. A mask or reticle writing tool is used to create the mask based upon the design layout, after which the mask can be used in a photolithographic process. Current mask writing tools typically use electron beams that handle only simple shapes such as rectangles and trapezoids which are derived through mask data preparation. Using polygon parameters to directly represent a guiding pattern can facilitate mask data preparation.

Optical Proximity Correction Tool

Figure 5:
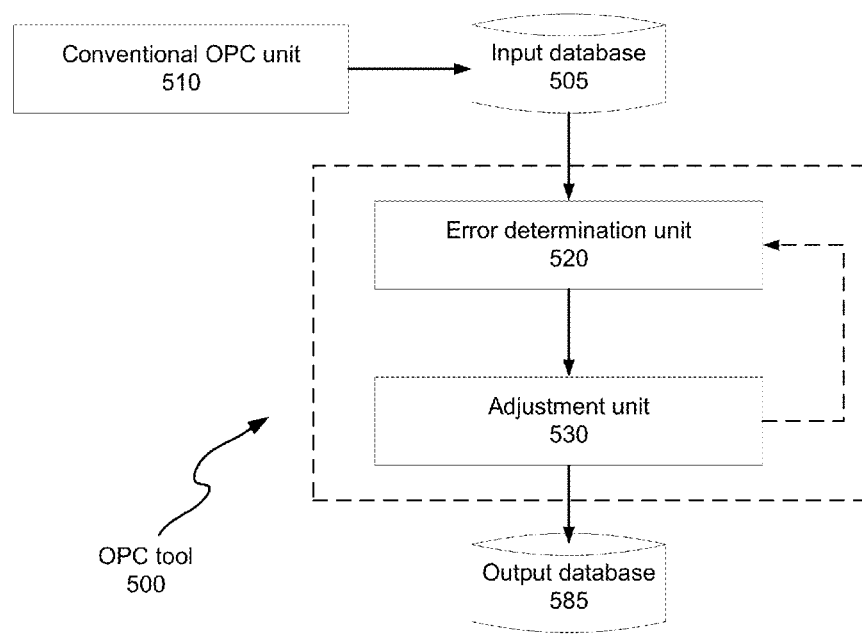
FIG. 5 illustrates an example of an optical proximity correction tool that may be implemented according to various embodiments of the disclosed technology.

FIG. 5 illustrates an example of an optical proximity correction tool 500 that may be implemented according to various embodiments of the disclosed technology. As seen in this figure, the optical proximity correction tool 500 includes an error determination unit 520 and an adjustment unit 530. Some implementations of the optical proximity correction tool 500 may cooperate with (or incorporate) one or more of a conventional OPC unit 510, an input database 505 and an output database 585.

As will be discussed in more detail below, the error determination unit 520 determines predicted print errors for two or more via-type features based on a predicted guiding pattern for the two or more via-type features, a target guiding pattern for the two or more via-type features, and correlation information between a plurality of guiding pattern parameters and location and size parameters for the two or more via-type features. Here, the predicted guiding pattern is derived based on an initial mask pattern for photomask fabrication. Based on the predicted print errors for the two or more via-type features, the adjustment unit 530 adjusts the initial mask pattern to generate a new mask pattern. The initial mask pattern may be generated by the conventional OPC unit 510 performing a plurality of conventional optical proximity correction iterations. The optical proximity correction tool 500 may repeat the determining and the adjusting by replacing the initial mask pattern with the new mask pattern until one of one or more termination conditions is met.

As previously noted, various examples of the disclosed technology may be implemented by one or more computing systems, such as the computing system illustrated in FIGS. 1 and 2. Accordingly, one or more of the error determination unit 520, the adjustment unit 530, and the conventional OPC unit 510 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the error determination unit 520, the adjustment unit 530, and the conventional OPC unit 510. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the error determination unit 520, the adjustment unit 530, and the conventional OPC unit 510 are shown as separate units in FIG. 5, a single computer (or a single processor within a master computer) or a single computer system may be used to implement all of these units at different times, or components of these units at different times.

With various examples of the disclosed technology, the input database 505 and the output database 585 may be implemented using any suitable computer readable storage device. That is, either of the input database 505 and the output database 585 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 505 and the output database 585 are shown as separate units in FIG. 5, a single data storage medium may be used to implement some or all of these databases.

Optical Proximity Correction

Figure 6:
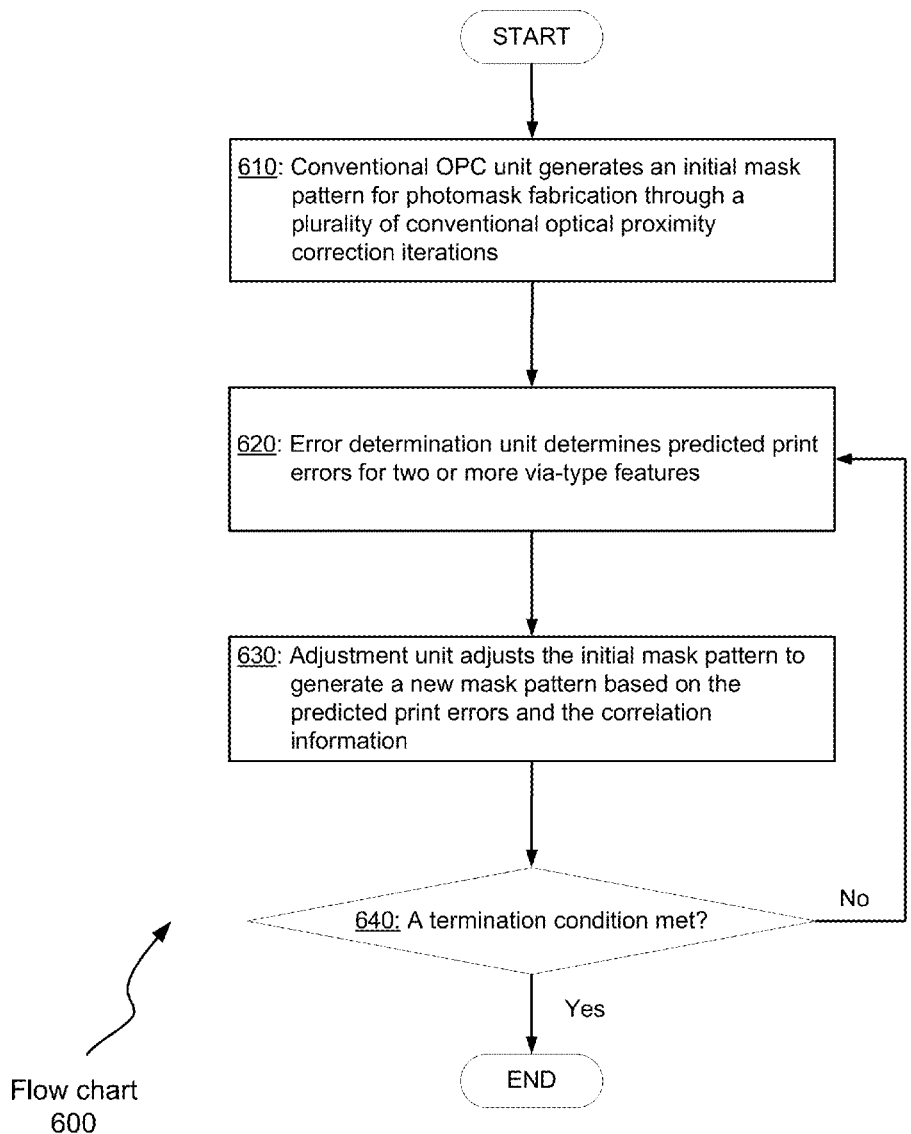
FIG. 6 illustrates an example of a flow chart describing a process of optical proximity correction that may be employed according to various embodiments of the disclosed technology.

FIG. 6 illustrates a flowchart 600 showing a process of optical proximity correction that may be implemented according to various examples of the disclosed technology. For ease of understanding, methods of optical proximity correction that may be employed according to various embodiments of the disclosed technology will be described with reference to the optical proximity correction tool 500 in FIG. 5 and the flow chart 600 illustrated in FIG. 6. It should be appreciated, however, that alternate implementations of an optical proximity correction tool 500 may be used to perform the methods of optical proximity correction illustrated by the flow chart 600 according to various embodiments of the disclosed technology. Likewise, the optical proximity correction tool 500 may be employed to perform other methods of optical proximity correction according to various embodiments of the disclosed technology. For example, one such method may be a process that does not include the operation 610 of the flowchart 600.

In operation 610, the conventional OPC unit 510 generates an initial mask pattern for photomask fabrication through a plurality of conventional optical proximity correction iterations. The initial mask pattern is for producing a target guiding pattern on chip through photolithography. The target guiding pattern is for producing two or more via-type features on chip through directed self-assembly.

Figure 7A:
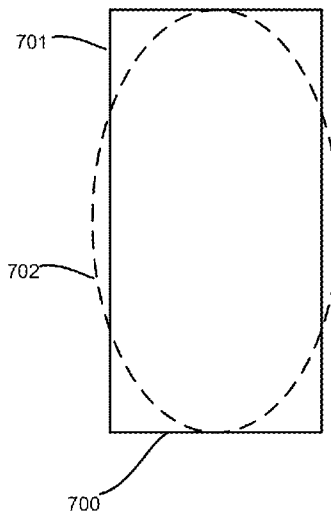
FIG. 7A illustrates a mask feature 700 and a simulated image of the mask feature.

In a conventional OPC process, the edges of the geometric elements in the design are fragmented. For example, as shown in FIG. 7A, an edge of the geometric element 701 used to create a mask feature 700 may be fragmented into edge fragments 701A-701F, shown in FIG. 7B. The size of the edge fragments in a given layout design depends upon the OPC process parameters, often referred to as the OPC recipe. The "recipe" specifies the size of the edge fragments. While not all edges within a layout design are fragmented in every OPC process, these edges may also be referred to as edge fragments. In a rule-based OPC process, the edge fragments are adjusted to compensate for proximity effects according to pre-computed look-up tables based on width and spacing between features.

Figure 7C:
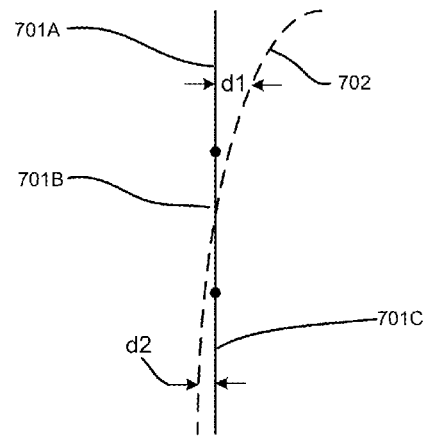
FIG. 7C illustrates edge displacement errors for some of the edge fragments.
Figure 7B:
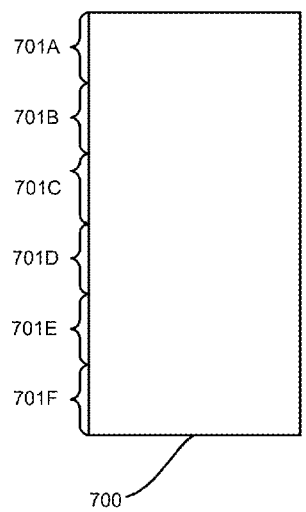
FIG. 7B illustrates an example of fragmentation of an edge of the mask feature 700.

In a model-based OPC process, the photolithographic process is simulated in order to produce a predicted print image (or predicted image), such as the example image 702 shown in FIG. 7A. This predicted print image is compared to the target print image (or target image). Typically, this comparison is done at each edge fragment. For example, as shown in FIG. 7C, the target image is a distance d1 away from the predicted image at the edge fragment 701A, the target image is a distance d2 away from the predicted image at the edge fragment 701C, while the target image intersects the predicted image at the edge fragment 701B. The distances between the target print image and the predicted print image are often referred to as the edge placement error (EPE). Accordingly, in most conventional model-based OPC processes each edge fragment or unfragmented edge has an associated edge placement error (also referred to as an associated edge placement error value).

Figure 7D:
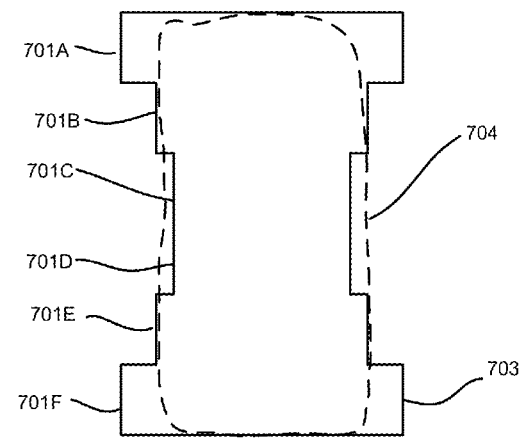
FIG. 7D illustrates a mask feature modified from the mask feature 700 by an OPC process and a corresponding simulated image.

Next, the edge fragments are individually moved or adjusted in order to enable the simulated image for the resulting mask to reproduce the target image as much as possible. For example, as shown in FIG. 7D, the edge fragment 701A is displaced in a direction away from the geometric element 701, in an effort to widen the corresponding portion of the image that would be produced by the resulting mask. Similarly, the edge fragment 701C is displaced in a direction toward from the geometric element 701, in an effort to narrow the corresponding portion of the image that would be produced by the resulting mask. Next, the image that would be produced by a mask using the displaced edge fragments is simulated, and the new predicted image is compared with the target image, and the edge placement error for each edge fragment is computed.

This process of moving the edge fragments, simulating the image that would be produced using the moved edge fragments, and comparing the simulated image to the target image may be repeated a number of times. Each cycle of moving edge fragments and comparing the new simulated image to target image is referred to as an iteration of the OPC process. Typically, edge fragments moved during a given iteration and the distance the edge fragments are displaced, are determined based upon the edge placement error. For example, because d1 is larger than d2 in FIG. 7C, a subsequent iteration of the optical proximity correction process may move edge fragment 701A a greater amount than edge fragment 701C.

The movement value for each edge fragment may be the edge placement error multiplied by a constant factor (feedback factor). This feedback factor may be location dependent or edge type dependent based on the OPC recipe. Methods that consider correlations between neighboring edge fragments such as those described in U.S. Pat. Nos. 14/183,209 and 14/183,228, which are incorporated herein by reference, may also be employed to derive the movement value (referred to as cross-MEEF(mask error enhancement factor)-based methods).

The OPC iteration process continues until the simulated image is sufficiently similar to the target image (e.g., both d1 and d2 are smaller than a threshold value), or until it is determined that the displacements of the edge fragments already have converged on locations where no further movement of the edge fragments will improve the simulated image. Once the final positions of the edge fragments are determined in the layout design data, as shown in FIG. 7D, a modified mask feature 703 can be created from the corrected layout design data. As shown in FIG. 7D, the image 704 produced by the modified mask feature 703 should more closely correspond to the target image.

In addition to the rule-based and model-based OPC technologies, the inverse lithography-based OPC technology has also be employed as a resolution enhancement technique. Inverse lithography treats the OPC as an inverse imaging problem and can provide unintuitive mask patterns. Some aspects of the lithography-based OPC are discussed in an article by J Word et al., "Inverse vs. traditional OPC for the 22 nm node", Proc. Of SPIE, Vol. 7274, 2009, which is incorporated herein by reference. While unintuitive mask patterns may be generated, the OPC is constrained to produce shapes which can be written by leading-edge mask writers. These mask writing tools typically handle only simple shapes such as rectangles and trapezoids. Thus, mask shapes produced by an inverse lithography-based OPC technique are eventually "fragmented".

The conventional OPC unit 510 may choose any of conventional OPC technologies such as those mentioned above or any kind of combinations of them to derive the initial mask pattern.

In operation 620, the error determination unit 520 determines predicted print errors for the two or more via-type features. Proximity effects sometimes cannot be completely compensated by conventional OPC techniques. Process variations may also lead to errors. Accordingly, the guiding pattern printed according to the target guiding pattern may not produce via-type features more faithfully than the one printed according to a different lithographic target. Rather than focusing only on the target guiding pattern, the optical proximity correction tool 500 uses the predicted print errors for the two or more via-type features to optimize the initial mask pattern.

The predicted print errors for the two or more via-type features are determined based on a predicted guiding pattern for the two or more via-type features, the target guiding pattern for the two or more via-type features, and correlation information between a plurality of guiding pattern parameters and location and size parameters for the two or more via-type features. The predicted guiding pattern is derived based on the initial mask pattern. The derivation may be performed by a commercial simulation tool, such as those in the Calibre family of software tools available from Mentor Graphics Corporation, Wilsonville, Oreg.

The correlation information may be determined by conducting a directed self-assemble process using chips printed with guiding patterns having various guiding pattern parameter values. The correlation information may also be determined based on simulations such as Monte-Carlo simulations. Another approach is to compare the predicted values of the location and size parameters for the initial guiding pattern with predicted values of location and size parameters for a guiding pattern obtained by enlarging or reducing the initial guiding pattern uniformly.

Figure 8:
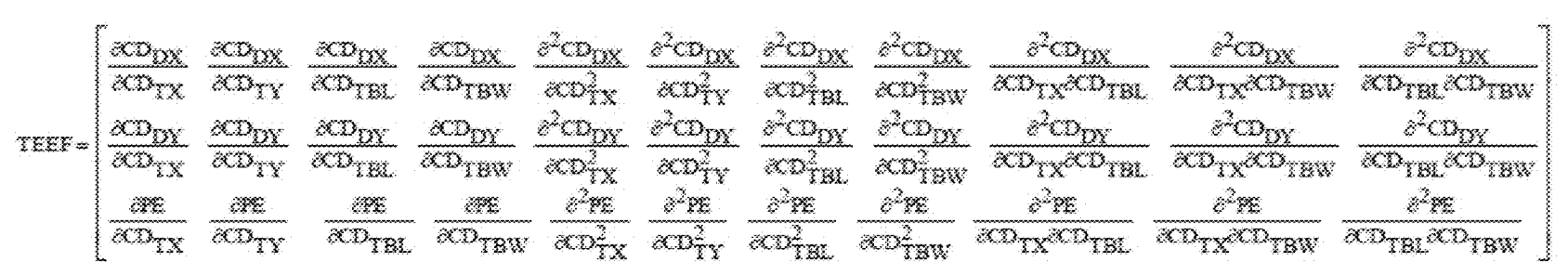

The correlation information may comprise a template error enhancement factor (TEEF) describing the relationship between changes in guiding pattern parameters and corresponding changes in feature critical dimension errors/placement errors. The template error enhancement factor (TEEF) may be represented by a matrix that includes only linear terms or both linear and non-linear terms. The guiding pattern parameters used in the TEEF may be a subset of the plurality of guiding pattern parameters. FIG. 8 illustrates an example of the TEEF. The guiding pattern parameters used in the TEEF shown in FIG. 8 are $CD_{TX}$, $CD_{TY}$, $CD_{TBL}$, and $CD_{TBW}$. The last three are shown in FIG. 3, and $CD_{TX}$ is a function of $CD_{TBL}$, and $CD_{HX}$:

$$CD_{TX} = \frac{CD_{HX} - CD_{TBL}}{2} \quad (1)$$

Figure 9:
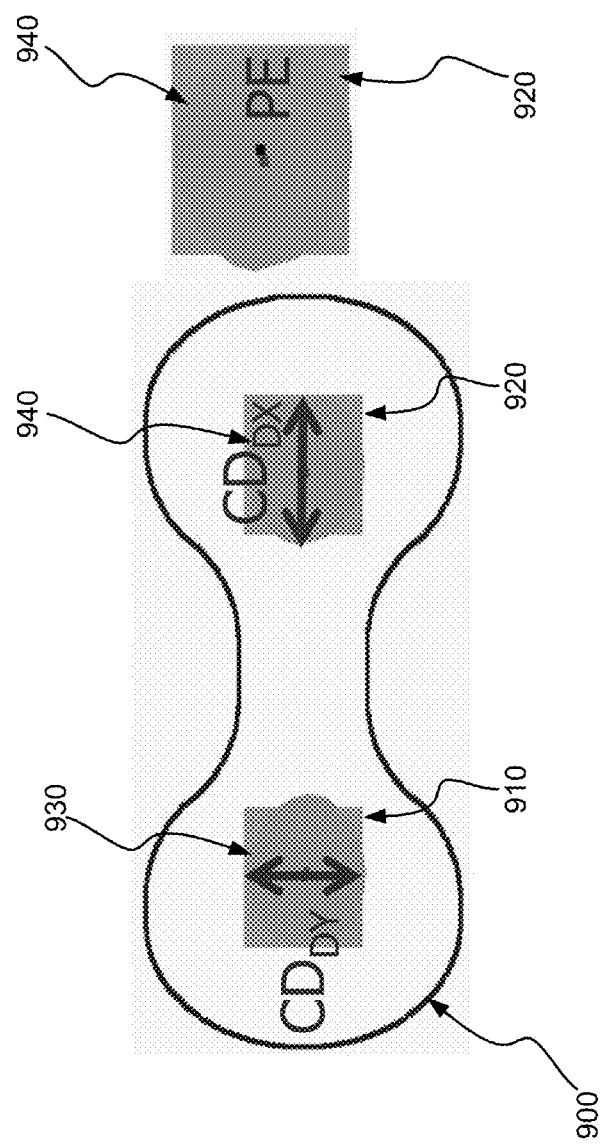
FIG. 9 illustrates an example of the location and size parameters that may be employed according to various embodiments of the disclosed technology.

An example of the feature critical dimension errors/placement errors used in the TEEF in FIG. 8 is illustrated in FIG. 9. In the figure, a guiding pattern 900 for two via-type features is shown. The target via-type features are represented by two squares 910 and 920. The predicted or actually printed features are shown as two ovals 930 and 940. PE is the placement error and the size parameters are labeled as $CD_{DX}$ (critical dimension along the design direction) and $CD_{DY}$ (critical dimension along the direction perpendicular to the design direction). Due to symmetry of the guiding pattern, only one set of $CD_{DX}$ and $CD_{DY}$ is needed.

Figure 11:
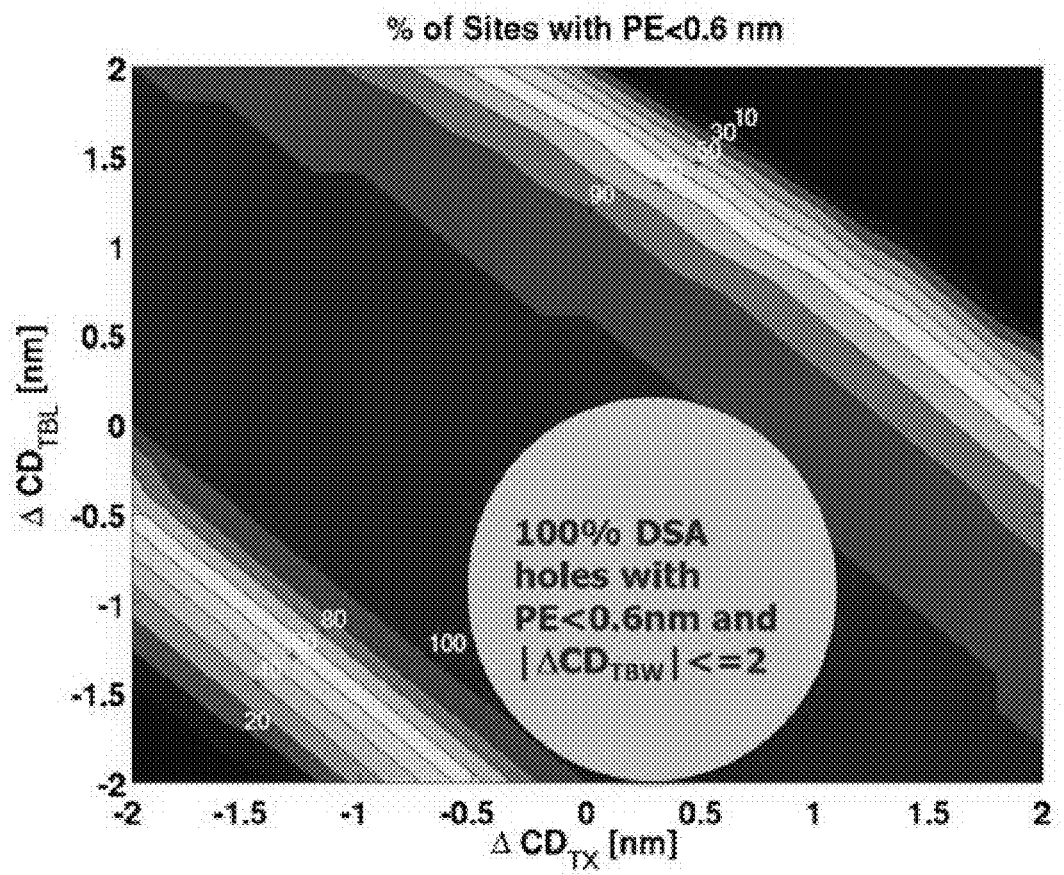
FIG. 11 illustrates a contour map generated using correlation information between guiding pattern parameters and location and size parameters for via-type features.

Because the TEEF describes the relation between changes on the guiding pattern parameters and changes on DSA patterning results, the predicted print errors such as changes of location and size of the two or more via-type features may be predicted from the changes of guiding pattern parameters which can be derived by comparing the predicted guiding pattern with the target guiding pattern. For example, $\Delta CD_{DX}$, which is the $CD_{DX}$ deviation, may be calculated as shown in FIG. 11.

In operation 630, the adjustment unit 530 adjusts the initial mask pattern to generate a new mask pattern based on the predicted print errors for the two or more via-type features and the correlation information. For a given via-type feature design target, there is usually a guiding pattern design zone. That is, different combinations of the guiding pattern parameter values can yield similar DSA patterning results. FIG. 11 illustrates an example of a contour map. The contour map is obtained as follows: placement errors are calculated based on TEEF in the space of $\Delta CD_{TX}$, $\Delta CD_{TBL}$, and $\Delta CD_{TBW}$ that are the template shape parameters deviations from the nominal design; black and white maps are then generated by denoting the sites where placement errors meet the overlay budget with "1" otherwise with "0"; and the contour map is generated by summing and normalizing the maps along the $\Delta CD_{TBW}$ direction. The number notation on the contour map represents the percentage of DSA cylinders formed with PE less than 0.6 in the space of $\Delta CD_{TX}$, $\Delta CD_{TBL}$, and $\Delta CD_{TBW}$, e.g. the slanted dark red region in the middle means 100% DSA holes with PE less than 0.6. The adjustment unit 530 may determine the OPC EPE spec to achieve the desired overlay budget requested by users and adjust the initial mask pattern accordingly.

I operation 640, the optical proximity correction tool 500 may determine whether one of one or more termination conditions is met. If yes, the process terminates. If not, the operations 620-630 are repeated by replacing the initial mask pattern with the new mask pattern. One termination condition may be limits of the predicted print errors. Another one may be a limit of the number of the iterations.

Conclusion

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. One or more non-transitory computer-readable media storing computer-executable instructions for causing one or more processors to perform a method, the method comprising:
    determining predicted print errors for two or more via-type features based on a predicted guiding pattern for the two or more via-type features, a target guiding pattern for the two or more via-type features, and correlation information between a plurality of guiding pattern parameters and location and size parameters for the two or more via-type features, wherein the predicted guiding pattern is derived based on an initial mask pattern for photomask fabrication and the correlation information comprises a template error enhancement factor (TEEF); and
    adjusting the initial mask pattern to generate a new mask pattern based on the predicted print errors for the two or more via-type features and the correlation information.

2. The one or more non-transitory computer-readable media recited in claim 1, wherein the method further comprises:
    repeating the determining and the adjusting by replacing the initial mask pattern with the new mask pattern until one of one or more termination conditions is met.

3. The one or more non-transitory computer-readable media recited in claim 1, wherein the initial mask pattern is generated by performing a plurality of conventional optical proximity correction iterations.

4. The one or more non-transitory computer-readable media recited in claim 1, wherein the guiding pattern parameters comprise longest length along line connecting the two via-type features, widest width, distance between two inflection points on two inner edges of a neck region and neck width in the middle of the initial guiding pattern.

5. The one or more non-transitory computer-readable media recited in claim 4, wherein the guiding pattern parameters further comprise curvatures around corners and slopes at inflection points.

6. The one or more non-transitory computer-readable media recited in claim 1, wherein the correlation information is derived based on simulation or empirical data.

7. The one or more non-transitory computer-readable media recited in claim 6, wherein the simulation is Monte Carlo simulation.

8. A method, executed by at least one processor of a computer, comprising:
    determining predicted print errors for two or more via-type features based on a predicted guiding pattern for the two or more via-type features, a target guiding pattern for the two or more via-type features, and correlation information between a plurality of guiding pattern parameters and location and size parameters for the two or more via-type features, wherein the predicted guiding pattern is derived based on an initial mask pattern for photomask fabrication and the correlation information comprises a template error enhancement factor (TEEF); and
    adjusting the initial mask pattern to generate a new mask pattern based on the predicted print errors for the two or more via-type features and the correlation information.

9. The method recited in claim 8, further comprising:
    repeating the determining and the adjusting by replacing the initial mask pattern with the new mask pattern until one of one or more termination conditions is met.

10. The method recited in claim 8, wherein the initial mask pattern is generated by performing a plurality of conventional optical proximity correction iterations.

11. The method recited in claim 8, wherein the guiding pattern parameters comprise longest length along line connecting the two via-type features, widest width, distance between two inflection points on two inner edges of a neck region and neck width in the middle of the initial guiding pattern.

12. The method recited in claim 11, wherein the guiding pattern parameters further comprise curvatures around corners and slopes at inflection points.

13. The method recited in claim 8, wherein the correlation information is derived based on simulation or empirical data.

14. The method recited in claim 13, wherein the simulation is Monte Carlo simulation.

15. A system comprising:
    one or more processors, the one or more processors programmed to perform a method, the method comprising:
    determining predicted print errors for two or more via-type features based on a predicted guiding pattern for the two or more via-type features, a target guiding pattern for the two or more via-type features, and correlation information between a plurality of guiding pattern parameters and location and size parameters for the two or more via-type features, wherein the predicted guiding pattern is derived based on an initial mask pattern for photomask fabrication and the correlation information comprises a template error enhancement factor (TEEF); and
    adjusting the initial mask pattern to generate a new mask pattern based on the predicted print errors for the two or more via-type features and the correlation information.

16. The system recited in claim 15, wherein the initial mask pattern is generated by performing a plurality of conventional optical proximity correction iterations.

* * * * *